US012537162B2

(12) United States Patent
Schmaunz et al.

(10) Patent No.: US 12,537,162 B2
(45) Date of Patent: Jan. 27, 2026

(54) METHOD OF OPERATING A PARTICLE BEAM SYSTEM AND RELATED SYSTEM AND COMPUTER PROGRAM PRODUCT

(71) Applicant: Carl Zeiss Microscopy GmbH, Jena (DE)

(72) Inventors: Andreas Schmaunz, Oberkochen (DE); Simon Diemer, Lauchheim (DE)

(73) Assignee: Carl Zeiss Microscopy GmbH, Jena (DE)

( * ) Notice: Subject to any disclaimer, the term of this patent is extended or adjusted under 35 U.S.C. 154(b) by 351 days.

(21) Appl. No.: 18/364,707

(22) Filed: Aug. 3, 2023

(65) Prior Publication Data

US 2024/0047175 A1 Feb. 8, 2024

(30) Foreign Application Priority Data

Aug. 4, 2022 (DE) ........................ 102022119555.4

(51) Int. Cl.
*H01J 37/304* (2006.01)
*H01J 37/02* (2006.01)
*H01J 37/26* (2006.01)
*H01J 37/28* (2006.01)

(52) U.S. Cl.
CPC .......... *H01J 37/304* (2013.01); *H01J 37/026* (2013.01); *H01J 37/265* (2013.01); *H01J 37/28* (2013.01); *H01J 2237/006* (2013.01)

(58) Field of Classification Search
CPC ...... H01J 37/304; H01J 37/206; H01J 37/265; H01J 37/28; H01J 2237/006
See application file for complete search history.

(56) References Cited

U.S. PATENT DOCUMENTS

2016/0071734 A1* 3/2016 Graf .................. H01L 21/31116 438/712
2016/0260574 A1 9/2016 Schmaunz et al.
2020/0335309 A1 10/2020 Schmaunz
2022/0230843 A1 7/2022 Orchowski

FOREIGN PATENT DOCUMENTS

DE 10 2015 204 091 A1 9/2016
DE 10 2018 222 522 A1 6/2020
DE 10 2019 214 936 A1 4/2021
DE 10 2020 122 535 A1 3/2022

OTHER PUBLICATIONS

German Office Action, with translation thereof, for corresponding DE Appl No. 10 2022 119 555.4, dated Apr. 21, 2023.

* cited by examiner

*Primary Examiner* — Sean M Luck
(74) *Attorney, Agent, or Firm* — Fish & Richardson P.C.

(57) ABSTRACT

A method of operating a particle beam system comprises determining values of operating parameters of the particle beam system, and operating the particle beam system with the determined values of the operating parameters, and also recording a particle-microscopic image of a sample via the particle beam system. The operating parameters can represent at least a magnitude of a flow of a gas fed to the sample for charge compensation, a current of a particle beam directed at the sample for recording the image, a kinetic energy of the particles of the particle beam upon impinging on the sample, a scanning speed of the particle beam over the sample for recording the image, and a magnification of the recorded image.

21 Claims, 6 Drawing Sheets

METHOD OF OPERATING A PARTICLE BEAM SYSTEM AND RELATED SYSTEM AND COMPUTER PROGRAM PRODUCT

CROSS-REFERENCE TO RELATED APPLICATION

This application claims benefit under 35 U.S.C. § 119 to German Application No. 10 2022 119 555.4, filed Aug. 4, 2022. The entire disclosure of this application is incorporated by reference herein.

FIELD

The present disclosure relates to a method of operating a particle beam system, to a particle beam system and to a computer program product. For example, the disclosure relates to a method of operating particle beam systems in which one or more particle beams are focused at a sample to be examined.

BACKGROUND

One example of such a particle beam system is a scanning electron microscope, in which a focused electron beam is scanned over a sample to be examined and secondary electrons or backscattered electrons, generated by the incident electron beam at the sample, are detected in a manner dependent on the deflection of the focused electron beam in order to generate an electron-microscopic image of the sample.

Focusing the beam of charged particles on a point typically means that a large number of charge carriers pass into the sample per unit time. The speed at which the charge carriers can flow away is usually dependent on the local constitution of the sample. Therefore, instances of local charging of a sample surface may occur, and may influence the quality of the particle-microscopic image. In order to counteract such instances of local charging, the sample can be provided with a conductive layer, which involves an additional work step. A high conductivity of the sample surface can ensure that particles of a particle beam focused on a point to be examined can flow away into the sample or a sample stage. In a further method, the pressure in the sample chamber is increased to approximately a few tens to a few hundreds of Pa, for example 100 Pa, as a result of which the conductivity of the surroundings can increase and can lead to the more rapid discharge of the sample as a result. In addition, a gas (usually nitrogen) can be guided directly to the sample surface via a nozzle and charge compensation can thus be achieved.

Feeding a gas can allow that an additional preceding work step is avoided and fine structures of the surface of the sample are not unrecognizably concealed by a layer. Feeding the gas directly to a local region of the sample can additionally mean that, in contrast to feeding gas into the entire vacuum chamber, the scattering of the particles at the gas can be kept low and accordingly the resolution of particle-microscopic images decreases only slightly. Moreover, in the case where the gas is fed locally, many of the conventional detectors can continue to be used.

The charge compensation achieved by the gas can improve with higher flow of the gas to the sample surface. However, excessively high flow of the gas can intensify a decrease in the resolution on account of scattering of the particles of the particle beam at the gas. In addition, a brightness and a contrast of particle-microscopic images can decrease as the flow of the gas increases. For a magnitude of the flow of the gas fed to the sample, it is generally desirable to find a value for which an effect of instances of local charging is as small as possible and at the same time the resolution and the contrast are as high as possible, and also the brightness is optimal.

For this purpose, in certain conventional methods for operating particle beam systems, a user records for example a particle-microscopic image with a specific gas flow and specific operating parameter values—not including the gas flow—of the particle beam system and, on the basis of this recorded particle-microscopic image, decides whether the value of the gas flow used brings about the fewest possible artefacts as a result of instances of local charging and an optimum brightness, and also an optimum contrast in the particle-microscopic image. Artefacts may be for example alternating sequences of white and black areas, also referred to as zebra patterns, sudden image changes in which an imaged structure of the sample has an unexpected displacement in the particle-microscopic image, distortions at edges, in which expected edges of the imaged structure of the sample differ greatly from edges in the particle-microscopic image, artefacts in which the brightness and the contrast vary between regions of the particle-microscopic image, and wavy distortions, in which highly wavy structures, such as sinusoidal structures, for example, are generally discernible in the particle-microscopic image. If the user is not satisfied with the aforementioned properties of the particle-microscopic image, then the user can change the value of the magnitude of the flow of the gas fed to the sample and once again records a particle-microscopic image with the same operating parameter values, not including the gas flow, and the user examines this image in regard to the aforementioned properties. This process can be repeated by the user until a suitable value of the gas flow has been found.

However, since the value of the magnitude of the flow of the gas fed to the sample is determined anew for each change in the operating parameter values of the particle beam system, this process ca be laborious, particularly for inexperienced users of the particle beam system.

SUMMARY

The present disclosure seeks to provide a method of operating a particle beam system which facilitates a setting of the magnitude of the flow of a gas fed to the sample for charge compensation.

In accordance with embodiments of the disclosure, a method of operating a particle beam system comprises determining values of operating parameters of the particle beam system, and operating the particle beam system with the determined values of the operating parameters, and also recording a particle-microscopic image of a sample via the particle beam system operated with the determined values of the operating parameters.

The operating parameters can represent at least a magnitude of a flow of a gas fed to the sample for charge compensation, as described above, a current of a particle beam directed at the sample for recording the image, a kinetic energy of the particles of the particle beam upon impinging on the sample, a scanning speed of the particle beam over the sample for recording the image, and a magnification of the recorded image. It should be noted that the operating parameters can also be other variables that imply the aforementioned variables. By way of example, an angle of rotation of a manual rotary valve of a gas line can also represent the magnitude of the flow of the gas fed to the sample.

In general, the operating parameters include a variable that represents the magnitude of the flow of the gas fed to the sample. Since the present application describes steps in which a value of a magnitude of the flow of the gas fed to the sample is determined and this determination can be based on a set of operating parameters which does not include the magnitude of the flow of the gas fed to the sample, this set of operating parameters is referred to hereinafter as "operating parameters not including the gas flow", for the sake of simplicity.

Determining the values of the operating parameters can comprise determining a value of the magnitude of the flow of the gas fed to the sample on the basis of a plurality of entries previously stored in a database and a present value of each of the operating parameters with the exception of the magnitude of the flow of the gas fed to the sample (to put it more precisely, each of the operating parameters not including the gas flow), wherein each entry includes at least one value of each of the operating parameters. Such embodiments can allow for an automatic determination of a value of the magnitude of the flow of the gas fed to the sample with low calculation complexity. The calculation complexity can be relatively low by virtue of the fact that a request and processing from a database involve fewer operations of a program than, for example, a determination on the basis of one or more recorded particle-microscopic images.

In accordance with some embodiments, the operating parameters furthermore include an average composition of the material of the sample, and a scanning strategy according to which the particle beam system moves the particle beam over the sample. In this case, the average composition of the material of the sample can be an average percentage value of the amount of the material in the sample. For example, in the case of technical products, the average composition of the material of the sample can be subdivided into sections corresponding to sections of the sample, such as layers of a semiconductor, for example. The scanning strategy according to which the particle beam system moves the particle beam over the sample can be characterized by settings of the particle beam system which include a set of points on the sample onto which the particle beam is intended to be directed, an order of the set of points according to which the particle beam is intended to be directed onto the points of the set of points, a speed at which the particle beam is moved from one point to another point, and a duration with which the particle beam is directed onto a point of the set of points. A value of the scanning strategy can be a number, for example, which can be assigned to a specific scanning strategy according to a numbering of a predetermined set of scanning strategies. Such embodiments make it possible, for example, for already known properties of the sample to be taken into account in the method. If a particle beam system is used exclusively for examining samples which have almost identical structures, then taking account of these structures can increase an accuracy of the determination of the flow of the gas fed to the sample.

In accordance with some embodiments, determining the value of the magnitude of the flow of the gas fed to the sample comprises selecting the value of the magnitude of the flow of the gas fed to the sample of that entry for which the values of the operating parameters not including the gas flow are the most similar to the present values of the operating parameters not including the gas flow. The similarity of the values can be determined here for example by way of a sum of weighted differences of the values of the operating parameters not including the gas flow. Weights of the weighted differences can be predetermined, or can be input by the user of the particle beam system in controller software. Such embodiments can make it possible to minimize a calculation complexity of the particle beam system and/or a server connected to the particle beam system.

In accordance with some embodiments, determining the magnitude of the flow of the gas fed to the sample comprises determining an interpolation function on the basis of the values of the operating parameters included in the entries of the database, wherein the interpolation function specifies a relationship between the values included in the entries of the database, and calculating the value of the magnitude of the flow of the gas fed to the sample for the present values of the operating parameters not including the gas flow, via the interpolation function. Such embodiments can make it possible to determine values for the magnitude of the flow of the gas fed to the sample which are not represented by entries in the database. The interpolation function can be carried out for example by way of a multidimensional spline interpolation or a linear interpolation.

In accordance with some embodiments, a method of operating a particle beam system furthermore comprises storing information concerning the interpolation function in the database, wherein the information is chosen such that the interpolation function can be reconstructed on the basis of the stored information. By way of example, an interpolation method used, and also the determined parameters of the resulting interpolation function can be stored for this purpose. What can be achieved as a result is that an interpolation function does not have to be determined for every recorded particle-microscopic image, as a result of which a calculation complexity of the particle beam system and/or a server connected to the particle beam system is reduced.

In accordance with some embodiments, a method of operating a particle beam system furthermore comprises storing the determined values of the operating parameters as an entry in the database. Consequently, the database can be continuously extended by the use thereof.

In accordance with embodiments of the disclosure, the method comprises determining an optimum value of the magnitude of the flow of the gas fed to the sample, and recording a particle-microscopic image of the sample via the particle beam system operated with the determined optimum value of the magnitude of the flow of the gas fed to the sample. Operating parameter values which do not represent the magnitude of the gas flow remain can unchanged and are used both in the method step of determining an optimum value of the magnitude of the flow of the gas fed to the sample and in the method step of recording a particle-microscopic image with the optimum value of the magnitude of the gas flow.

Determining the optimum value of the magnitude of the flow of the gas fed to the sample can additionally comprise recording a series of particle-microscopic images with in each case changed values of the magnitude of the flow of the gas fed to the sample, and determining the optimum value of the magnitude of the flow of the gas fed to the sample on the basis of a measure of a similarity between particle-microscopic images of the series of particle-microscopic images. Such embodiments can make it possible to carry out a precise determination of the optimum value of the magnitude of the flow of the gas fed to the sample, which determination does not depend on operating parameters selected in advance.

In accordance with some embodiments, an imaged region of the sample and/or a magnification of the particle-microscopic images of the series of particle-microscopic images remain(s) unchanged. For example, the values of the operating parameters not including the gas flow are not changed during the recording of the series of particle-microscopic images since the intention is to effect an assignment of the magnitude of the gas flow with the quality of a particle-microscopic image. The quality of a particle-microscopic image can be characterized by the aspects already mentioned above.

In accordance with some embodiments, recording the series of particle-microscopic images with in each case changed values of the magnitude of the flow of the gas fed to the sample comprises increasing the value of the magnitude of the flow of the gas fed to the sample with each of the recorded particle-microscopic images. In accordance with some other embodiments, recording the series of particle-microscopic images with in each case changed values of the magnitude of the flow of the gas fed to the sample can comprise decreasing the value of the magnitude of the flow of the gas fed to the sample with each of the recorded particle-microscopic images. These embodiments can use an ordered series of particle-microscopic images which are ordered either according to ascending flow of the gas or according to descending flow of the gas. The use of an ordered series of particle-microscopic images can allow for different values of the magnitude of the flow of the gas fed to the sample to be checked systematically.

In accordance with embodiments of the disclosure, the method comprises recording a plurality of particle-microscopic images of the sample via the particle beam system and changing the magnification with each of the plurality of particle-microscopic images in conjunction with a constant value of the magnitude of the flow of the gas fed to the sample, and determining an optimum value of the flow of the gas fed to the sample if a value of a measure of a similarity between two of the plurality of particle-microscopic images falls below a threshold value. In embodiments, the value of the flow of the gas fed the sample can be determined by the second method as described above. Such embodiments can make it possible to carry out a setting of a magnification to a determined value simultaneously with an adaptation of the value of the magnitude of the flow of the gas fed to the sample. In the case where the magnification of a particle-microscopic image is changed, the value of the gas flow generally has to be changed in order to achieve the same effect as in the original particle-microscopic image since the particle beam is scanned over a smaller area in the case of a magnified image and instances of local charging are thus fostered. A simultaneous adaptation of the gas flow with the magnification for the particle beam system can make it possible to eliminate carrying out an additional step after the magnification.

In accordance with some embodiments, in the case of a magnification, the optimum value of the flow of the gas fed to the sample is determined by one of the embodiments above.

In accordance with further embodiments, determining the optimum value of the magnitude of the flow of the gas fed to the sample comprises recording a series of particle-microscopic images with in each case changed values of the magnitude of the flow of the gas fed to the sample and constant magnification, and determining the optimum value of the magnitude of the flow of the gas fed to the sample on the basis of a measure of a similarity between a particle-microscopic image of the series of particle-microscopic images and a particle-microscopic image of the plurality of particle-microscopic images. In contrast to some the embodiments described above, in such an embodiment, a present magnified particle-microscopic image is compared with an unmagnified or less magnified particle-microscopic image. This can be realized by comparing the magnified image with a segment of the unmagnified or less magnified image which corresponds to the magnified image. Since an optimum gas flow has already been found for the unmagnified or less magnified image, these embodiments have the feature that an optimum corresponding image segment is already known which can be compared directly with a present image. Accordingly, a quality of the article-microscopic images can be consistent across a magnification.

A particle beam system comprising a controller configured to carry out the method disclosed is furthermore disclosed.

A computer program product containing computer-readable instructions which cause a controller of a particle beam system to carry out the method disclosed is furthermore disclosed. The computer program product can be stored in a non-volatile storage mechanism, such as, for example, a hard disk, a USB stick, a non-volatile storage mechanism of a cloud, or the like.

BRIEF DESCRIPTION OF THE DRAWINGS

Hereinafter, specific embodiments are illustrated by the figures, which are described in greater detail in the description.

DETAILED DESCRIPTION

Embodiments are described in detail below with reference to the drawings.

Figure 1:
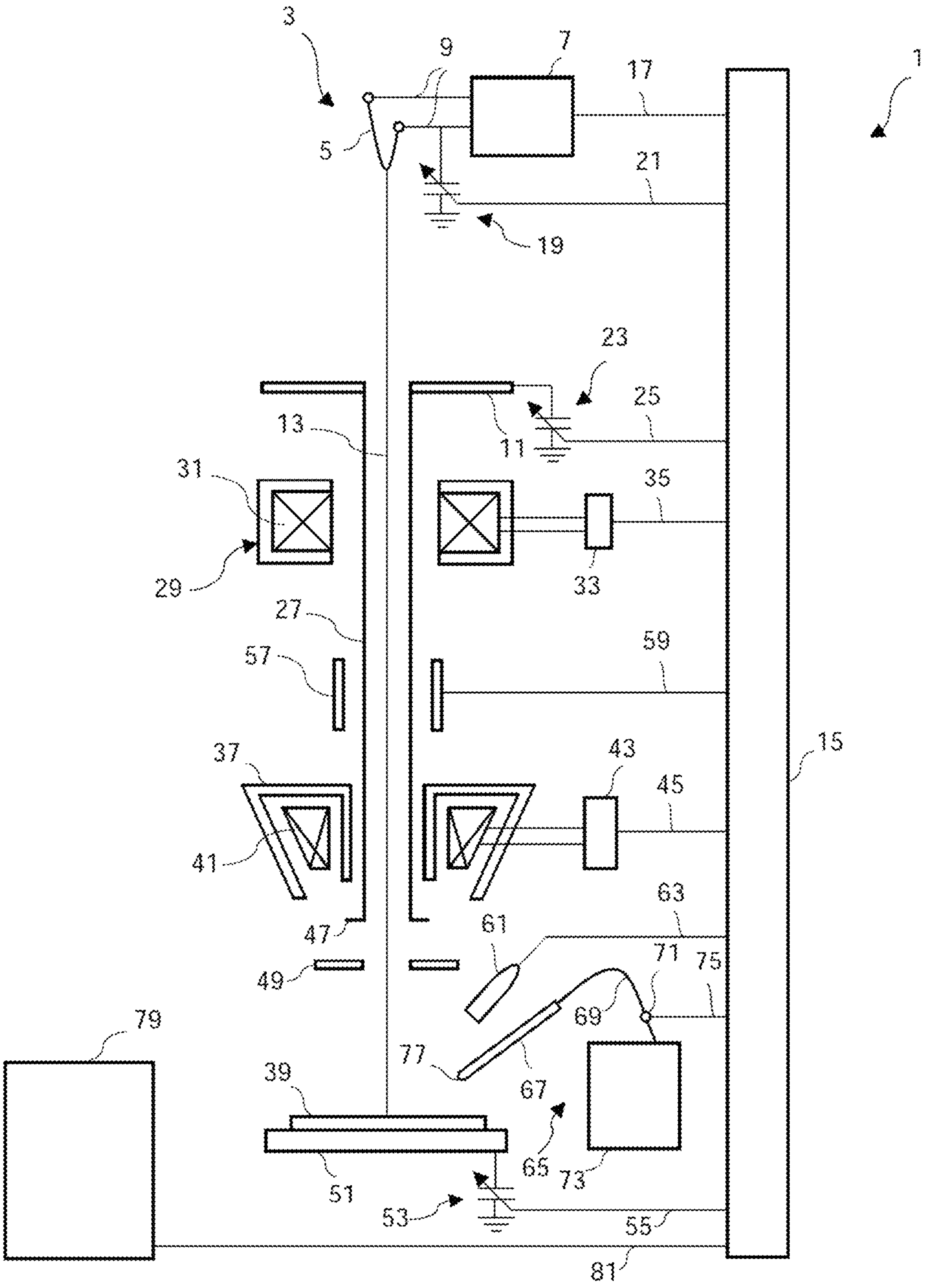
FIG. 1 shows a schematic set-up of a particle beam system which can be used for carrying out the method disclosed herein.

FIG. 1 shows a schematic set-up of a particle beam system 1 which can be operated by a method in accordance with embodiments of the disclosure. The particle beam microscope 1 comprises a particle source 3 comprising a particle emitter 5 and a driver 7. By way of example, the particle emitter 5 can be a cathode heated by the driver 7 by way of lines 9, said cathode emitting electrons which are accelerated away from the emitter 5 by an anode 11 and shaped to form a particle beam 13. To this end, the driver 7 is controlled by a controller 15 of the particle beam microscope 1 by way of a control line 17 and an electric potential of the emitter is set by way of an adjustable voltage source 19, which is controlled by the controller 15 by way of a control line 21. An electric potential of the anode 11 is set by way of an adjustable voltage source 23, which is likewise controlled by the controller 15 by way of a control line 25. A difference between the electric potential of the emitter 5 and the electric potential of the anode 11 defines the kinetic energy of the particles of the particle beam 13 after passing through the anode 11. The anode 11 forms the upper end of a beam tube 27, into which the particles of the particle beam 13 enter after passing through the anode 11.

The particle beam 13 passes through a condenser lens 29 which collimates the particle beam 13. In the illustrated example, the condenser lens 29 is a magnetic lens with a coil 31, which is excited by a current generated by an adjustable current source 33 controlled by the controller 15 by way of a control line 35.

The particle beam 13 thereupon passes through an objective lens 37, which is intended to focus the particle beam 13 at a surface of a sample 39 to be examined. In the illustrated example, the objective lens 35 comprises a magnetic lens, the magnetic field of which is generated by a coil 41, which is excited by a current source 43 controlled by the controller 15 by way of a control line 45. The objective lens 37 further comprises an electrostatic lens, the electrostatic field of which is generated between a lower end 47 of the beam tube 27 and an electrode 49. The beam tube 27 is electrically connected to the anode 11 and the electrode 49 can be electrically connected to the earth potential or be set to a potential different from earth via a further voltage source (not illustrated in FIG. 1) controlled by the controller 15.

The sample 39 is held on a sample stage 51, the electric potential of which is set by way of a voltage source 53 controlled by the controller 15 by way of a control line 55. The sample 39 is electrically connected to the sample stage 51, and so the sample 39 also has the electric potential of the sample stage 51. A difference between the electric potential of the particle emitter 5 and the electric potential of the sample 39 defines the kinetic energy of the particles of the particle beam 13 when incident on the sample 39. In comparison therewith, the particles may have greater kinetic energy within the beam tube 27 and when passing through the condenser lens 29 and the objective lens 37 if they are decelerated by the electrostatic field between the end 49 of the beam tube 27 and the electrode 49 and/or by an electric field between the electrode 49 and the sample 39. However, it is also possible to embody the particle beam system 1 without beam tube 27 and electrode 49, and so the particles are decelerated or accelerated by an electric field between the anode 11 and the sample 39 prior to being incident on the sample 39. Independently of the embodiment of the particle beam system 1 with or without beam tube 27 and independently of the embodiment and arrangement of the electrode 49, the kinetic energy of the particles when incident on the sample 39 is only dependent on the difference between the potentials of the particle source 3 and of the sample 39.

The particle beam system 1 furthermore comprises a deflection device 57 which is controlled by the controller 15 by way of a control line 59 and which deflects the particle beam 13 such that the particle beam 13 can scan a scan region 61 on the sample 39 under control of the controller 15. The particle beam system 1 further comprises a detector 61, which is positioned in such a way that signals which are generated by the particle beam 13 directed at the sample 39 and which leave the sample are able to be incident on the detector 61 in order to be detected by the latter. These signals can comprise particles such as, for instance, backscattered electrons and secondary electrons or radiation such as, for instance, cathodoluminescence radiation.

In the particle beam microscope 1 illustrated in FIG. 1, the detector 61 is a detector arranged next to the objective lens 37 and in the vicinity of the sample. However, it is also possible for the detector to be arranged in the beam tube 27 or at any other suitable position. For example, if an electric field at the surface of the sample 39 has a decelerating effect on the incident electrons of the particle beam 13, secondary electrons leaving the sample at low velocity are accelerated into the beam tube 27 by this electric field and become detectable by a detector arranged in the beam tube 27 (not illustrated in FIG. 1).

The particles emanating from the sample 39 are caused by the particle beam 13 being incident on the sample 39. For example, these detected particles can be particles of the particle beam 13 itself, which are scattered or reflected at the sample 39, such as, for example, backscattered electrons, or they can be particles which are separated from the sample 39 by the incident particle beam 13, such as, for example, secondary electrons. However, the detector 61 can also be embodied in such a way that it detects radiation, such as, for example, X-ray radiation, which is generated by the particle beam 13 incident on the sample 39. Detection signals from the detector 61 are received by the controller 15 by way of a signal line 63. The controller 15 stores data derived from the detection signals depending on the current setting of the deflection device 57 during a scanning process, and so these data represent a particle-microscopic image of the scan region of the sample 39.

The particle beam system 1 furthermore comprises a gas feeding system 65 comprising a hollow needle 67, a gas line 69, a valve 71 and a gas tank 73. The gas tank 73 contains the gas used for charge compensation, and can for example be integrated in a housing of the particle beam system 1 or be an external gas cylinder connected to the particle beam system 1 by way of the gas line 69. The valve 71 is a magnetic valve, for example, which can be controlled by electrical signals, and is controlled by the controller 15 by way of a control line 75. The valve 71 forms a part of the gas line 69. A setting of the valve 71 controls a magnitude of a gas flow through the gas line 69. The gas line 69 connects the gas tank 73 to the hollow needle 67. The hollow needle 67 comprises an opening 77, from which gas that flows through the hollow needle 67 can flow out in a controlled direction. Some other apparatus which enables gas to be fed locally can also be used as an alternative to the hollow needle 67.

The hollow needle 67 is oriented such that gas flowing out through the opening is guided onto a point of the sample 39 onto which the particle beam 13 is directed by the deflection device 57. For this purpose, the hollow needle 67 can be installed in a movable manner in the particle beam system 1. By way of example, the hollow needle 67 can be moved by the controller 15 by way of a drive motor (not illustrated in FIG. 1) to a corresponding location from which a gas flowing out of the opening 77 of the hollow needle 67 impinges on an image field on the sample 39 which the controller 15 scans using the particle beam 13 by way of the deflection device 57.

The particle beam system 1 furthermore comprises a database 79, which the controller can access by way of a control line 81. The database 79 can be for example an internal memory of the particle beam system 1, a local server, a cloud, or the like. The control line 81 can be either a wired or a wireless connection between the controller 15 and the database 79.

The database 79 includes at least information concerning a magnitude of the flow of the gas fed to the sample 39 for charge compensation, a set current of the particle beam 13 directed at the sample 39, a kinetic energy of the particles of the particle beam 13 upon impinging on the sample, a scanning speed of the particle beam 13 over the sample, and a magnification carried out by the deflection device 57. The database 79 can furthermore include information concerning an average composition of a material of the sample 39, and concerning a scanning strategy according to which the particle beam system moves the particle beam over the sample. The scanning strategy specifies for example a set of points onto which the particle beam 13 is directed by the deflection device 57, an order in which the set of points is ordered, a speed at which the particle beam 13 is moved from one point to another point, and a duration regarding how long the particle beam 13 is directed onto a point by the deflection device 57. Information concerning the scanning strategy can be stored in the form of an integral value, for example, which should be equated with a predetermined assignment corresponding to a specific scanning strategy. The database is organised by entries which each include at least one value of each of the operating parameters. These entries represent settings of the particle beam system 1 which were used to obtain optimum particle-microscopic images in accordance with the criteria mentioned above.

Figure 2:
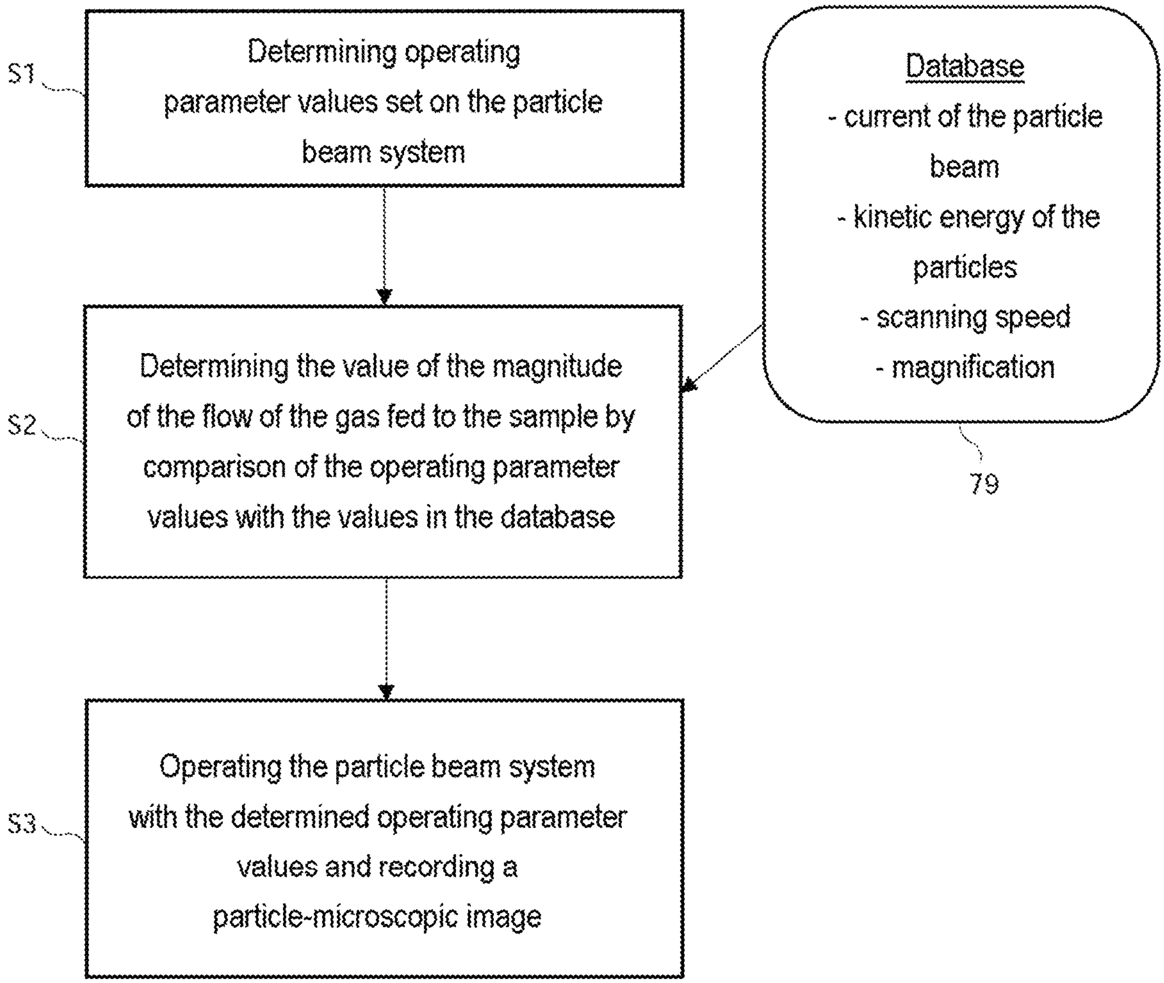
FIG. 2 shows a flowchart for explaining the method of operating the particle beam microscope from FIG. 1 in accordance with a first embodiment.

The method of operating the particle beam system 1 in accordance with a first embodiment is described below with reference to FIG. 2. FIG. 2 shows a flowchart for explaining the method of operating the particle beam microscope 1 from FIG. 1 in accordance with a first embodiment. The flowchart shows steps S1 to S3, and also the database 79.

In step S1, the controller 15 determines operating parameter values set on the particle beam system 1. Alternatively, in step S1, the controller 15 can determine values of operating parameters not including the gas flow since a value of the magnitude of the flow of the gas fed to the sample 39 is intended to be determined in step S2 and, accordingly, this value is not required from step S1. Preferably, a user of the particle beam system 1 can input, in controller software, desired values of the operating parameters not including the gas flow which are intended to allow a particle-microscopic image to be recorded. The controller 15 then reads out from the controller software the values that have been input, and thus determines the values of the operating parameters not including the gas flow. Alternatively, the controller 15 can determine the operating parameter values by way of measurements on the corresponding components of the particle beam system 1. By way of example, a difference in the electric potential between the sample stage 51 and the particle emitter 5 can be measured in order to determine a kinetic energy of the particles when incident on the sample 39. Determining the operating parameter values by way of measurements can be advantageous primarily in the case of particle beam systems on which various operating parameter values can be set manually.

In step S2, the controller 15 determines the value of the magnitude of the flow of the gas fed to the sample 39 by way of a comparison of the operating parameter values with the values in the database 79. For this purpose, the controller 15 firstly compares the operating parameters for which values were determined in step S1 with the operating parameters stored in the database 79 and discards all values concerning operating parameters which are not included in the database 79.

In this case, the database 79 includes at least operating parameters which represent a magnitude of the flow of the gas fed to the sample 39 for charge compensation, a set current of the particle beam 13 directed at the sample 39, a kinetic energy of the particles of the particle beam 13 upon impinging on the sample, a scanning speed of the particle beam 13 over the sample, and a magnification carried out by the deflection device 57. In specific embodiments, the database can explicitly include a percentage opening of the valve 71, a heating voltage applied to the particle emitter 5 by the driver 7, a potential difference between the sample stage 51 and the particle emitter 5, a scanning speed striven for by the controller 15 at the deflection device 57, and a magnification of particle-microscopic images striven for by the controller 15 at the deflection device 57. In accordance with further embodiments, the database 79 can include percentage proportions of a material composition of the sample 39 and an integral value which should be equated with a scanning strategy in accordance with a predetermined assignment. The database 79 includes entries which each have at least one of the aforementioned operating parameter values. Each entry is a set of operating parameter values which can be used to obtain an optimum particle-microscopic image in accordance with the criteria mentioned above.

The determination of the value of the magnitude of the flow of the gas fed to the sample 39 by the controller 15 in step S2 is then realized by a comparison of the non-discarded operating parameters not including the gas flow from step S1 with the operating parameters stored in the database 79. By way of example, it is possible to determine which entry of the database 79 has values of the operating parameters not including the gas flow which are the most similar to the non-discarded values of the operating parameters not including the gas flow from step S1. The similarity between the values of the operating parameters not including the gas flow in an entry of the database 79 and the non-discarded values of the operating parameters not including the gas flow from step S1 can be for example a weighted sum of the respective differences between the values of the operating parameters not including the gas flow in the entry and the non-discarded values of the operating parameters not including the gas flow from step S1. The value of the magnitude of the flow of the gas fed to the sample 39 can be read from the entry having the greatest similarity.

In alternative embodiments, it is possible firstly to determine an interpolation function on the basis of the values of the operating parameters of the controller 15 included in the entries of the database 79, wherein the interpolation function specifies a relationship between the values included in the entries of the database 79. The interpolation function can be calculated for example by way of a multidimensional spline interpolation. With the aid of the determined interpolation function, it is then possible to calculate the value of the magnitude of the flow of the gas fed to the sample 39 for the (present) non-discarded values of the operating parameters not including the gas flow from step S1. Consequently, values of the magnitude of the flow of the gas fed to the sample 39 which are not stored in the database 39 can also be determined.

Information concerning the determined interpolation function from which the interpolation function can be reconstructed can be stored in the database 79 by the controller 15 by way of the control line 81 in order not to have to calculate an interpolation function—which is identical under certain circumstances—each time the method is carried out, and in order thus to relieve the burden on the controller 15. Furthermore, the controller 15 can also store the operating parameter values determined in steps S1 and S2 as an entry in the database 79. In a case in which the database 79 is an external server or a cloud, a verification step can be provided, in which the determined operating parameter values are firstly stored temporarily in a further storage medium and are transferred into the database 79 and stored therein only when the determined operating parameter values have been checked by an experienced user of the particle beam system 1.

The controller 15 then carries out step S3 in FIG. 2, wherein the controller operates the particle beam system 1 with the determined operating parameter values and records a particle-microscopic image during this operation.

Figure 3:
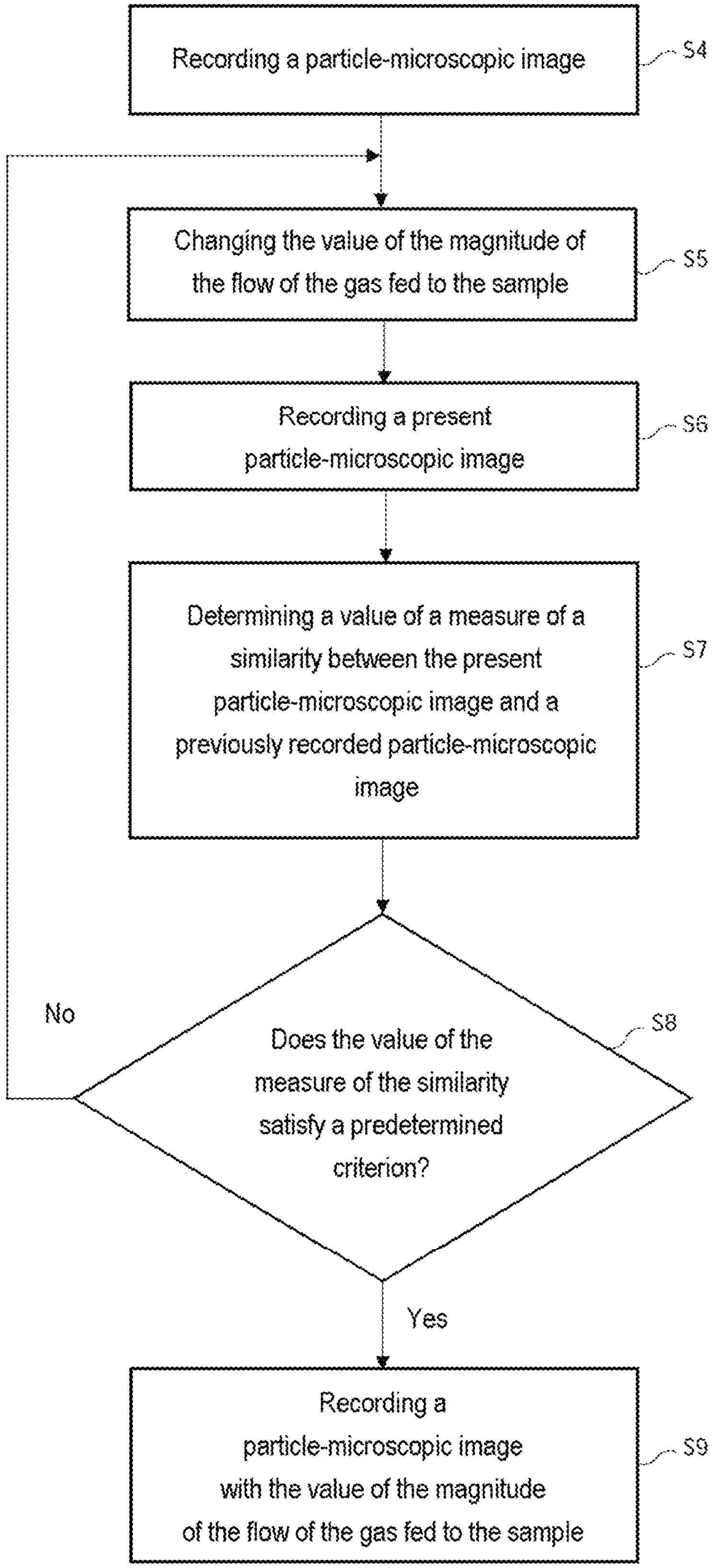
FIG. 3 shows a flowchart for explaining the method of operating the particle beam microscope from FIG. 1 in accordance with a second embodiment.

The method of operating the particle beam system 1 in accordance with a second embodiment is described below with reference to FIG. 3. FIG. 3 shows a flowchart for explaining the method of operating the particle beam microscope 1 from FIG. 1 in accordance with a second embodiment. The flowchart shows steps S4 to S9. The database 79 described in FIG. 1 is not required for the method in the second embodiment.

Firstly, in step S4, a first particle-microscopic image of a region of the sample 39 is recorded by the controller 15. Afterwards, the controller 15 changes the value of the magnitude of the flow of the gas fed to the sample 39 in step S5 and records a further particle-microscopic image of the region of the sample 39 in step S6.

In step S7, the controller 15 then compares the two particle-microscopic images with one another on the basis of a previously determined measure of a similarity between two particle-microscopic images.

Figure 5:
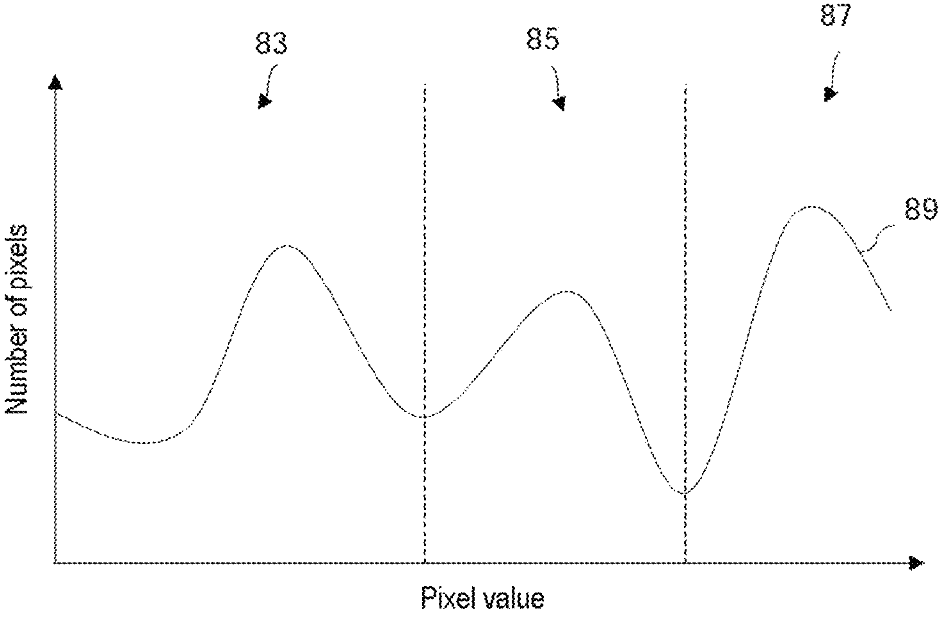
FIG. 5 shows a histogram of pixel values of a particle-microscopic image for explaining the method in accordance with the second embodiment.

The way in which a value of the measure of the similarity between two recorded particle-microscopic images can be determined by way of example is explained below with reference to FIGS. 5 and 6. FIG. 5 shows a histogram of pixel values of a particle-microscopic image for explaining the method in accordance with the second embodiment. Pixel values present in a particle-microscopic image are plotted on the horizontal axis. The number of pixels which have the respective pixel value in the particle-microscopic image is plotted on the vertical axis. If a classification algorithm is applied, such as a k-means algorithm or an EM algorithm, for example, then the pixel values are subdivided into the three classes 83, 85 and 87. Class 83 includes all pixels which have a small pixel value. Class 85 includes pixels which have a medium pixel value, and class 87 includes pixels which have a high pixel value. The number of classes is three in this exemplary case. However, the number of classes can assume any desired whole number. It should be noted that a large number of classes divides the pixel values in small increments, as a result of which information present in the pixel values may be excessively weighted in further calculations.

Figure 6:
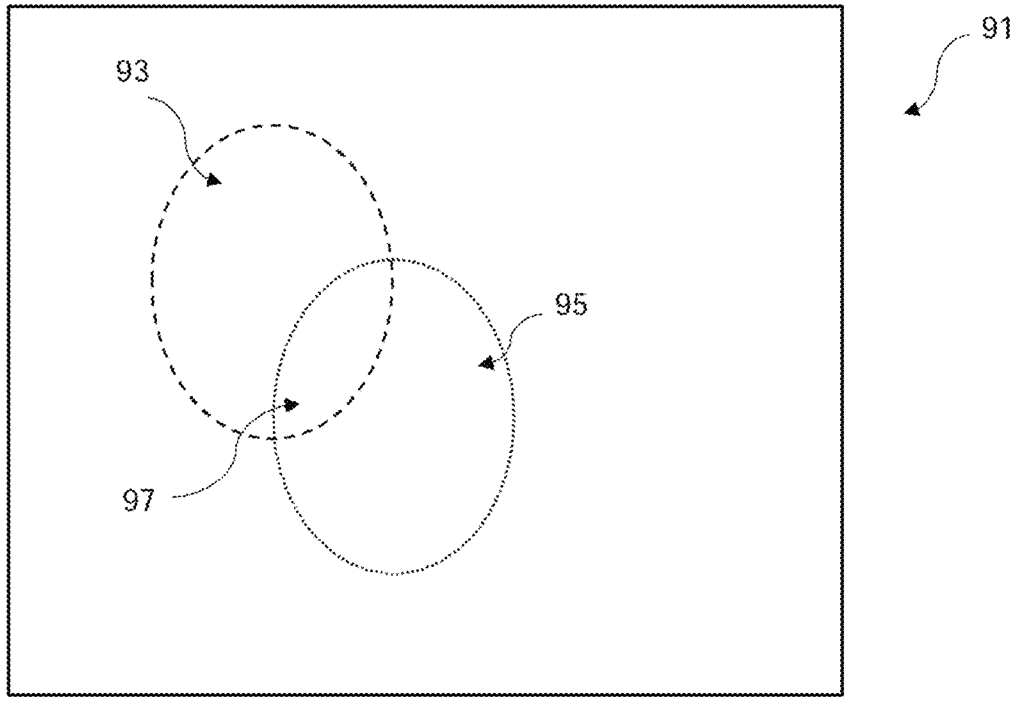
FIG. 6 shows a schematic diagram for explaining the method in accordance with the second embodiment.

FIG. 6 shows a schematic diagram for explaining the method in accordance with the second embodiment. FIG. 6 illustrates an image 91 that is superimposed for visualization purposes, the image representing image information from two particle-microscopic images. A first particle-microscopic image comprises pixels 93 assigned to one of the classes 83, 85 or 87. A second particle-microscopic image comprises pixels 95 assigned to the same class 83, 85 or 87 as the pixels 93 of the first particle-microscopic image. The pixels 95 of the second particle-microscopic image are displaced relative to the pixels 93 of the first particle-microscopic image. In an intermediate step, the pixel values of pixels which are included neither in the pixels 93 nor in the pixels 95 can be normalized to 0 and the pixel values of the pixels 93 and 95 can be normalized to 1.

On the basis of the pixels 93 and 95, it is possible to determine an overlap 97 which includes pixels which are assigned to the same class 83, 85 or 87 in both particle-microscopic images. This overlap 97 accordingly represents a region which has pixels having a similar pixel value in both particle-microscopic images. By repeating the determination of the overlap 97 for each of the classes 83, 85 and 87, it is thus possible to obtain a total set of similar pixels. This total set of similar pixels indicates a value of a measure of a similarity of two particle-microscopic images. The total set of similar pixels can be normalized in relation to the total number of pixels of the particle-microscopic images.

It should be noted that a value of a measure of a similarity can alternatively be determined via a value of a dissimilarity. In the case of the determination described above with reference to FIGS. 5 and 6, a value of a dissimilarity can be determined for example by determining the number of pixels which are included in the pixels 93 and 95, but are not included in the overlap 97. Such pixels have pixel values which are assigned to different classes 83, 85 or 87 in both particle-microscopic images and thus have pixel values that differ greatly from one another.

Alternatively, the value of the measure of the similarity between two images can be determined in some other way. It is possible, for example, to allow a trained neural network to determine the similarity of two images. The training of this neural network can be based on a large data set of images of the particle beam system 1 and particle-microscopic images newly recorded by users of the particle beam system 1 can be included in the data set.

In step S7, the controller 15 determines a value of the measure of the similarity between the present particle-microscopic image and the previously recorded particle-microscopic image. In step S8, the controller 15 then decides whether the value of the measure of the similarity determined in step S7 satisfies a predetermined criterion, e.g. exceeds a predetermined threshold value. If this is not the case (No in step S8), then the controller returns to step S5.

During renewed iteration of steps S5 to S8, the controller 15 records a new particle-microscopic image with a changed value of the magnitude of the flow of the gas fed to the sample 39. During renewed performance of step S7, accordingly, the present particle-microscopic image is the particle-microscopic image recorded during renewed performance of step S6. This present particle-microscopic image can then be compared with one of the previously recorded particle-microscopic images in step S7. It is accordingly possible to compare the present particle-microscopic image in each pass with the previous particle-microscopic image. Alternatively, it is also possible to compare the present particle-microscopic image in each pass with the first particle-microscopic image recorded in step S4.

If the value of the measure of the similarity satisfies the predetermined criterion (Yes in step S8), then the controller continues with step S9. In step S9, the controller operates the particle beam system 1 with the present value of the magnitude of the flow of the gas fed to the sample 39 which was set in step S5, and records a particle-microscopic image with the value of the magnitude of the flow of the gas fed to the sample 39.

Figure 7:
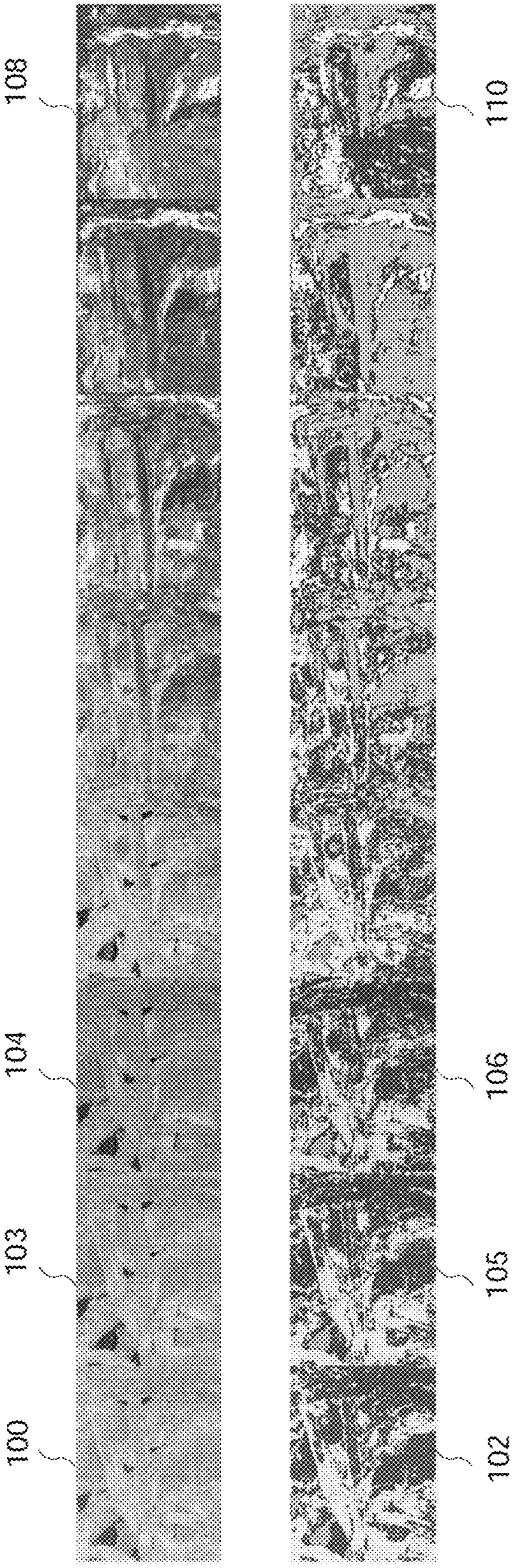
FIG. 7 shows series of unprocessed and processed particle-microscopic images for explaining the method in accordance with the second embodiment.

FIG. 7 shows an upper series of eight particle-microscopic images recorded with a value of the magnitude of the flow of the gas fed to the sample which decreases from the left image 100 to the right image 108. The artefacts already described above, such as wavy structures, for example, are discernible in the right image 108. The particle-microscopic image 104 represents an optimum value of the magnitude of the flow of the gas fed to the sample.

FIG. 7 shows, in a lower series, eight particle-microscopic images corresponding to the respective upper particle-microscopic images, wherein pixels which are assigned to the same class have the same pixel value. The three classes 83, 85 and 87 are accordingly coloured white, grey and black, respectively. If the method in accordance with the second embodiment is started with a low value of the magnitude of the gas fed to the sample, firstly in step S4 the left image 100 is recorded. The controller 15 then continues with steps S5 and S6, whereby a further particle-microscopic image 103 is recorded. In step S7, the particle-microscopic image 100 and the particle-microscopic image 103 are then each subdivided into three classes 83, 85 and 87 via a classification algorithm being applied to the pixel values. The classified pixels are represented by the images 102 and 105. FIG. 7 reveals that the images 102 and 105 are greatly similar. Accordingly, a value of the measure of the similarity as described above will be high. The controller 15 arrives at step S8, in which for example the criterion that the value of the measure of the similarity falls below a predetermined threshold value can be used in this case. Since the value of the measure of the similarity of the images 102 and 105 is high, however, the controller 15 returns to steps S5 and S6 and records the particle-microscopic image 104 with a further reduced value of the magnitude of the gas fed to the sample. In step S7, the pixels of the particle-microscopic image 104 are once again divided into the three classes 83, 85 and 87 which are represented by the image 106. The pixels represented by the image 106 are then checked for similarity for example with the pixels represented by the image 102. Since the image 106 has fewer black values than the image 102, the value of the measure of the similarity will be lower. Given a suitably chosen threshold value, the controller then decides in step S8 that this value of the measure of the similarity satisfies the predetermined criterion, and proceeds to step S9. Consequently, a value of the magnitude of the flow of the gas fed to the sample can easily be determined.

Figure 4:
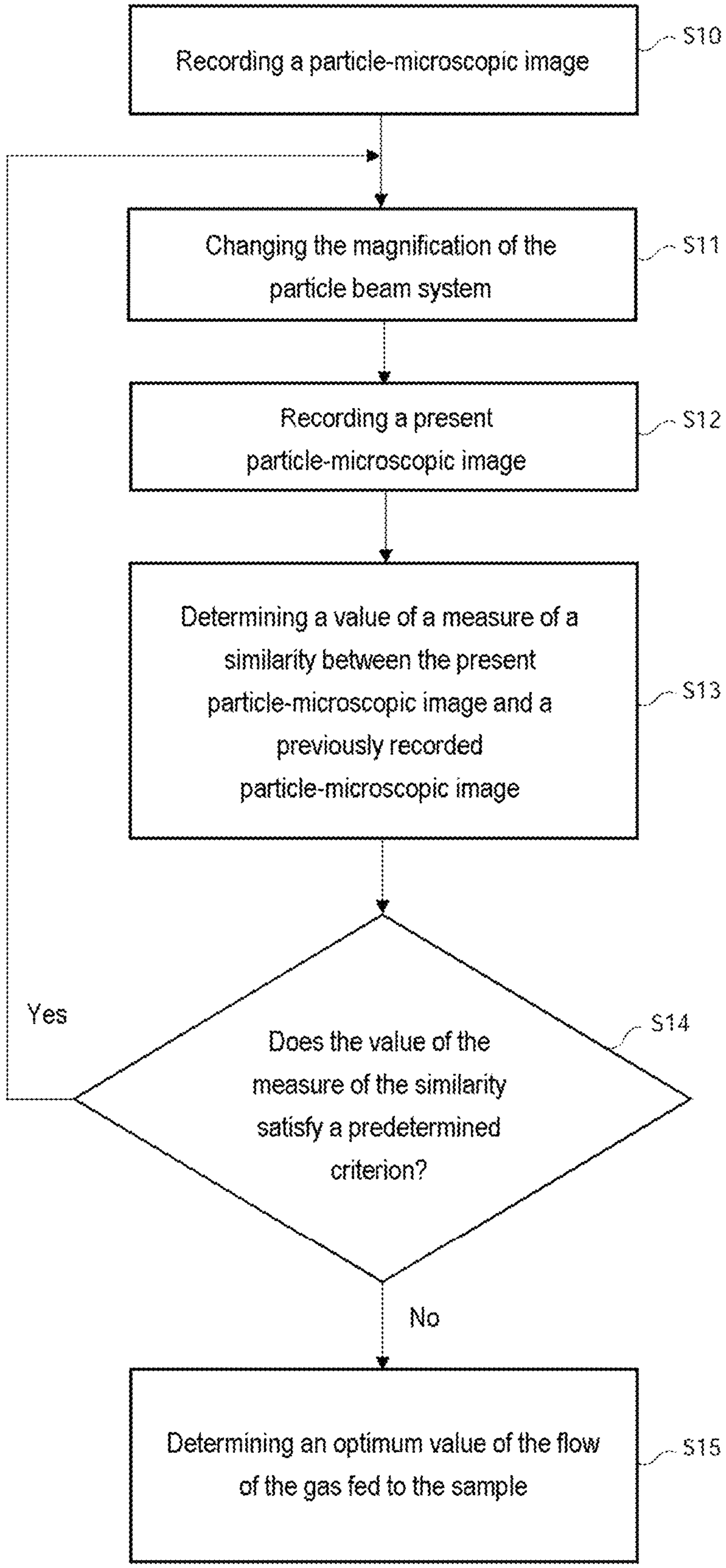
FIG. 4 shows a flowchart for explaining the method of operating the particle beam microscope from FIG. 1 in accordance with a third embodiment.

The method of operating the particle beam system 1 in accordance with a further embodiment is described below with reference to FIG. 4. FIG. 4 shows a flowchart for explaining the method of operating the particle beam microscope 1 from FIG. 1 in accordance with a third embodiment. The flowchart shows steps S10 to S15. The database 79 described in FIG. 1 is not required for the method in accordance with the third embodiment.

Steps S10 to S15 are carried out by the controller 15. In this case, the controller 15 goes through steps which are similar to the method in accordance with the second embodiment. For example, steps S10 and S12 to S14 respectively correspond to steps S4 and S6 to S8. A redundant description of these steps is therefore omitted and primarily differences in the method between the second embodiment and the third embodiment are described.

In the method in accordance with the third embodiment, the controller 15 changes the magnification of particle-microscopic images in step S11. During iteration of steps S11 to S14, the magnification of the particle-microscopic images of the particle beam system 1 is thus progressively changed until the value of the measure of the similarity no longer satisfies a predetermined criterion in step S14. In other words, the magnification is changed until the similarity falls below a specific threshold value (No in step S14). The controller 15 then proceeds to step S15 and thus decides that the value of the flow of the gas fed to the sample 39 is determined anew.

Determining an optimum value of the flow of the gas fed to the sample 39 can be carried out by the method in accordance with the second embodiment as illustrated in FIG. 3. Alternatively, however, step S15 can also be realized using the first method.

Step S15 can also comprise recording a series of particle-microscopic images with in each case changed values of the magnitude of the flow of the gas fed to the sample 39 and constant magnification, and determining the optimum value of the magnitude of the flow of the gas fed to the sample 39 on the basis of a measure of a similarity between a particle-microscopic image of the series of particle-microscopic images and a particle-microscopic image of the particle-microscopic images recorded in steps S10 to S14. This differs from the method of the second embodiment primarily in that a present particle-microscopic image in step S16 is compared with one of the particle-microscopic images from steps S10 to S14. For this purpose, for example, the particle-microscopic image from steps S10 to S14 is trimmed to the magnified region of the image and this trimmed region is compared with the present particle-microscopic image for a specific gas flow by way of the above-described measure of the similarity.

The present description has described a method of operating the particle beam system 1 by way of multiple embodiments which can be used to automatically carry out a determination of the optimum value of the magnitude of the flow of the gas fed to the sample 39. As a result, operation of the particle beam system 1 is simplified for a user and even inexperienced users can set an optimum gas flow on the particle beam system 1.

The description of the embodiments is given for illustrative purposes merely by way of example and does not restrict the scope of the disclosure. A person skilled in the art will recognize that multiple different embodiments of the disclosure are possible which have not been described by way of example. These are included within the scope of the patent claims.

What is claimed is:

1. A method, comprising:

determining values of operating parameters of a particle beam system;

using the determined values to operate the particle beam system; and using the particle beam system to record an image of a sample, wherein:

the operating parameters represent at least: a magnitude of a flow of a gas fed to the sample for charge compensation; a current of a particle beam directed at the sample for recording the image; a kinetic energy of the particles of the particle beam upon impinging on the sample; a scanning speed of the particle beam over the sample for recording the image; and a magnification of the recorded image;

determining the values of operating parameters comprises determining a value of the magnitude of the flow of the gas fed to the sample based on a plurality of entries previously stored in a database and a present value of each of the operating parameters with the exception of the magnitude of the flow of the gas fed to the sample; and each entry comprises at least one value of each of the operating parameters.

2. The method of claim 1, wherein the operating parameters further comprise:

an average composition of the material of the sample; and a scanning strategy according to which the particle beam system moves the particle beam over the sample.

3. The method of claim 1, wherein determining the value of the magnitude of the flow of the gas fed to the sample comprises selecting the value of the magnitude of the flow of the gas fed to the sample of that entry for which the values of the operating parameters with the exception of the magnitude of the flow of the gas fed to the sample are most similar to the present values of the operating parameters with the exception of the magnitude of the flow of the gas fed to the sample.

4. The method of claim 1, wherein determining the magnitude of the flow of the gas fed to the sample comprises:

determining an interpolation function based on the values of the operating parameters included in the entries of the database, the interpolation function specifying a relationship between the values included in the entries of the database; and using the interpolation function to calculate the value of the magnitude of the flow of the gas fed to the sample for the present values of the operating parameters with the exception of the magnitude of the flow of the gas fed to the sample.

5. The method of claim 4, further comprising storing information concerning the interpolation function in the database, wherein the information is chosen so that the interpolation function is reconstructable based on the stored information.

6. The method of claim 1, further comprising storing the determined values of the operating parameters as an entry in the database.

7. One or more machine-readable hardware storage devices comprising instructions that are executable by one or more processing devices to perform operations comprising the method of claim 1.

8. A system, comprising:

one or more processing devices; and one or more machine-readable hardware storage devices comprising instructions that are executable by the one or more processing devices to perform operations comprising the method of claim 1.

9. The system of claim 8, further comprising a controller, wherein the system is a particle beam system, and the controller is configured to receive the instructions to operate the particle beam system.

10. A method, comprising:

determining an optimum value of a magnitude of a flow of a gas fed to a sample in a particle beam system; and using the optimum value of the magnitude of the flow of the gas fed to the sample to operate the particle beam system to record an image of the sample, wherein:

determining the optimum value of the magnitude of the flow of the gas fed to the sample comprises recording a series of images with, in each case, changed values of the magnitude of the flow of the gas fed to the sample; and determining the optimum value of the magnitude of the flow of the gas fed to the sample on the basis of a measure of a similarity between images of the series of images.

11. The method of claim 10, wherein an imaged region of the sample and/or a magnification of the images of the series of images remain(s) unchanged.

12. The method of claim 10, wherein recording the series of images with, in each case, changed values of the magnitude of the flow of the gas fed to the sample comprises increasing the value of the magnitude of the flow of the gas fed to the sample with each of the recorded images.

13. The method of claim 10, wherein recording the series of images with, in each case, changed values of the magnitude of the flow of the gas fed to the sample comprises decreasing the value of the magnitude of the flow of the gas fed to the sample with each of the recorded images.

14. One or more machine-readable hardware storage devices comprising instructions that are executable by one or more processing devices to perform operations comprising the method of claim 10.

15. A system, comprising:

one or more processing devices; and one or more machine-readable hardware storage devices comprising instructions that are executable by the one or more processing devices to perform operations comprising the method of claim 10.

16. The system of claim 15, further comprising a controller, wherein the system is a particle beam system, and the controller is configured to receive the instructions to operate the particle beam system.

17. A method, comprising:

using a particle beam system to record a plurality of images of a sample in the particle beam system, wherein a magnification is changed with each of the images in conjunction with a constant value of a magnitude of a flow of a gas fed to the sample; and when a value of a measure of a similarity between two of the plurality of images falls below a threshold value, determining an optimum value of the flow of the gas fed to the sample.

18. The method of claim 17, wherein determining the optimum value of the magnitude of the flow of the gas fed to the sample comprises:

recording a series of images with, in each case, changed values of the magnitude of the flow of the gas fed to the sample and constant magnification; and determining the optimum value of the magnitude of the flow of the gas fed to the sample on the basis of a measure of a similarity between an image of the series of images and an image of the plurality of images.

19. One or more machine-readable hardware storage devices comprising instructions that are executable by one or more processing devices to perform operations comprising the method of claim 17.

20. A system, comprising:

one or more processing devices; and one or more machine-readable hardware storage devices comprising instructions that are executable by the one or more processing devices to perform operations comprising the method of claim 17.

21. The system of claim 20, further comprising a controller, wherein the system is a particle beam system, and the controller is configured to receive the instructions to operate the particle beam system.

* * * * *